(12) United States Patent
Ma (10) Patent No.: US 6,812,145 B2
(45) Date of Patent: Nov. 2, 2004

(54) METHOD OF REDUCING PLASMA CHARGING DAMAGE DURING DIELECTRIC ETCH PROCESS FOR DUAL DAMASCENE INTERCONNECT STRUCTURES

(76) Inventor: Shawming Ma, 244 Gabilan Ave., Sunnyvale, CA (US) 94086

( * ) Notice: Subject to any disclaimer, the term of this patent is extended or adjusted under 35 U.S.C. 154(b) by 5 days.

(21) Appl. No.: 10/456,190

(22) Filed: Jun. 5, 2003

(65) Prior Publication Data

US 2003/0216036 A1 Nov. 20, 2003

Related U.S. Application Data

(62) Division of application No. 10/013,180, filed on Dec. 7, 2001, now Pat. No. 6,613,666.

(51) Int. Cl.[7] .......................... H01L 21/44; H01L 23/52

(52) U.S. Cl. ........................ 438/653; 438/637; 257/751

(58) Field of Search ................................ 438/700–703, 438/733, 669–688, 653–656, 643, 648, 637, 627, 650; 257/751

(56) References Cited

U.S. PATENT DOCUMENTS

| | | | |
|---|---|---|---|
| 4,778,776 A | 10/1988 | Tong et al. ................. | 437/228 |
| 5,441,849 A | 8/1995 | Shiraishi et al. ............ | 430/296 |
| 5,468,341 A | 11/1995 | Samukawa ................... | 216/69 |
| 6,040,243 A | * 3/2000 | Li et al. ..................... | 438/687 |
| 6,051,479 A | 4/2000 | Hong ......................... | 438/425 |
| 6,060,347 A | 5/2000 | Wang ......................... | 438/215 |
| 6,114,182 A | 9/2000 | Tabara ......................... | 438/17 |
| 6,284,657 B1 | 9/2001 | Chooi et al. ................. | 438/687 |
| 6,350,700 B1 | 2/2002 | Schinella et al. ........... | 438/723 |
| 6,355,563 B1 | 3/2002 | Cha et al. ................... | 438/687 |

FOREIGN PATENT DOCUMENTS

| | | | |
|---|---|---|---|
| JP | 6/252076 | 9/1994 | ........... H01L/21/26 |
| JP | 9-064348 | 3/1997 | ........... H01L/29/78 |
| JP | 2000-331990 | 11/2000 | ....... H01L/21/3065 |
| JP | 2000-340543 | 12/2000 | ....... H01L/21/3065 |

OTHER PUBLICATIONS

J–P Carrére et al., "Electron–Shading Characterization in a HDP Contact Etching Process Using a Patterned CHARM Wafer".

C. Cismaru et al., "Synchroton radiation–induced surface–conductivity of $SiO_2$ for modification of plasma charging", *Applied Physics Letters*, vol. 76, No. 16, pp. 2191–2193 (Apr. 2000).

(List continued on next page.)

Primary Examiner—Matthew Smith
Assistant Examiner—Calvin Lee
(74) Attorney, Agent, or Firm—Shirley L. Church; Joseph Bach (57) ABSTRACT

Charging damage, caused by electron shading during plasma etching in a dual damascene structure, is alleviated by first depositing a protective conductive layer which provides a conductive path for maintaining charge balance in the etched structures. This conductive layer reduces the buildup of unbalanced positive charge in the contact opening, and the damage done to underlying layers caused by the resultant tunneling current. Further, if the protective conductive layer comprises a material which can also serve as an interdiffusion barrier layer for the contact opening fill material, a separate subsequent step to deposit such a barrier layer on the contact opening sidewall is avoided. Further, in the process of doing lithography on the trench etch resist layer, the protective conductive layer also functions as an antireflective coating, permitting the stepper to accurately focus the desired pattern.

15 Claims, 9 Drawing Sheets

OTHER PUBLICATIONS

K. Hashimoto, "Charge Damage Caused by Electron Shading Effect", *Jpn Appl. Phys.*, Part 1, vol. 33, No. 10, pp. 6013–6018 (Oct. 1994).

S. Tabara, "A New Etching Method for Reducing the Electron Shading Damage Using ICP Etcher", International Symposium on Plasma Process–Induced Damage, P2ID, Proceedings 1996, IEEE, Piscataway, NJ, 96TH8142, pp. 51–53 (1996).

S. Tabara, "WSi$_2$/Polysilicon Gate Etching Using TiN Hard Mask in Conjunction with Photoresist", *Jpn. J. Appl. Phys.*, Part 1, vol. 36, No. 4B, pp. 2508–2513 (1997).

T. Tanaka et al., "Reduction of Device in ICP Sources", *Jpn. Proc. Symp. Dry Process*, vol. 22, pp. 223–230 (2000).

Wafer Charging Bulletin, Wafer Charging Monitors, Inc.: Woodside, CA, pp. 1–4 (2000).

* cited by examiner

METHOD OF REDUCING PLASMA CHARGING DAMAGE DURING DIELECTRIC ETCH PROCESS FOR DUAL DAMASCENE INTERCONNECT STRUCTURES

This application is a divisional application of application Ser. No. 10/013,180 filed Dec. 7, 2001, and which is now U.S. Pat. No. 6,613,666.

BACKGROUND OF THE INVENTION

1. Field of the Invention

The present invention relates to the alleviation of charge buildup on integrated circuit components during dry plasma etching of semiconductor interconnect feedthrough structures.

2. Brief Description of the Background Art

In the quest for ever-higher circuit densities in modern very large scale integrated circuit semiconductors, engineers have moved from conventional chip layouts, in which interconnects between active regions on the chip are formed by metallic, generally aluminum, conductors in the plane of the devices, connected layer-to-layer mostly at the outer edges, to dual damascene architecture. In a dual-damascene structure, multiple layers of active devices are separated by layers of dielectric material, which are traversed within a given layer by trenches filled with conductive materials, which in turn are connected layer-to-layer by interconnects formed by filling through-openings with conductive materials. These contact openings, typically referred to as vias, are etched through the intervening dielectric layer or layers.

These trenches and contact openings are etched in the dielectric layers by means of dry etching, utilizing a plasma generated by exposing appropriate etchant source gases, often halogen-comprising gases, to powerful electromagnetic fields. The resultant plasma consists of free electrons, positively charged ions, and various high energy species of the plasma source gas. The workpiece to be etched typically has a desired pattern superimposed upon it in some form of mask. The mask is generally formed photolithographically upon an organic photoresist material, which is developed to provide open areas where etching is desired.

To achieve anisotropic etching, that is, etching which is generally unidirectional, so that positively charged active species travel vertically downward through the opening in the resist layer toward the etch front within the deepening etched feature, the workpiece is maintained at a negative electrical potential. This serves to accelerate positively-charged species toward the target surface, but leaves the electrons in the plasma less able to penetrate to the bottom of the etched feature.

This phenomenon, the ability of only positively charged high energy species to penetrate to the lower regions of the etch front, while electrons accumulate near the top of the opening, is called electron shading. The electron shading effect is self-perpetuating, since the accumulation of electrons near the opening creates a local electric field which further repels electrons from entering, but continues to easily permit the positively charged high energy species, such as ions, accelerated by the electrical potential, to penetrate to the full depth of the etched feature. When the resultant positive charge near the bottom of the feature becomes sufficiently high, it results in a tunneling current which can do severe damage to underlying layers.

The aspect ratio of a feature typically refers to the ratio of the depth of the feature to its smallest horizontal cross-sectional dimension. The electron shading effect, and the resultant charging damage to the structure, begin to be significant in etched features having an aspect ratio greater than about 2. The electron shading effect gets worse as the aspect ratio increases, since the electron accumulation near the opening and top sidewalls of the feature makes it increasingly difficult for anything but the positively charged high energy species to get past that entrance and any distance down into the deepening etched feature.

FIGS. 1A–1G show a typical set of process steps for creating a dual damascene structure. Electron shading effects are often a serious problem during fabrication of dual damascene structures.

Figure 1A:
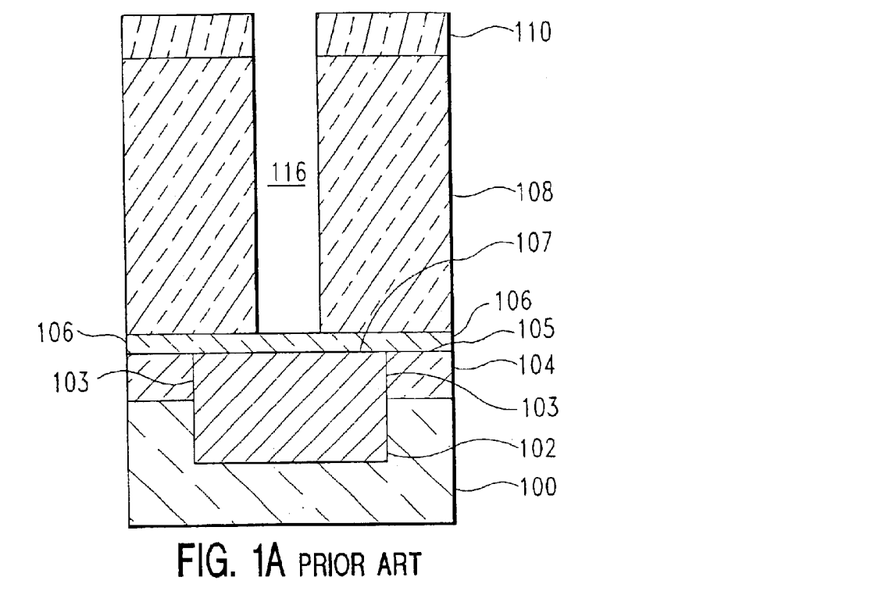
FIGS. 1A–1G, discussed in the Background of the Invention section, above, show a comparative example process of etching a trench overlying a contact opening to provide a conductive interconnect through a dielectric layer or layers separating two conductive regions in a dual damascene semiconductor structure. As previously discussed herein, FIG. 1D particularly illustrates the mechanism of electron shading, and resultant charge buildup and charging damage, incurred in carrying out such an etching process.

In FIG. 1A, a conductor 102, such as copper or aluminum or alloys thereof, is embedded in a dielectric 100. An upper portion of the conductor is contacted at sidewall 103 by a layer of a first dielectric hardmask 104. The upper surface 105 of dielectric hardmask layer 104 and the upper surface 107 of conductor 102, are covered by an etch stop layer 106, which is typically a dielectric such as $Si_3N_4$, SiON, or SiC. A layer of dielectric 108, which is typically a low-k dielectric overlies the etch stop layer 106, and is itself overlain by a second dielectric hardmask layer 110. (A "low-k dielectric" is one with a relative dielectric permittivity, κ, less than that of $SiO_2$, or less than about 3.9.) A via or other contact opening 116 has been etched through dielectric hardmask layer 110 and dielectric layer 108, to the etch stop layer 106.

Figure 1B:
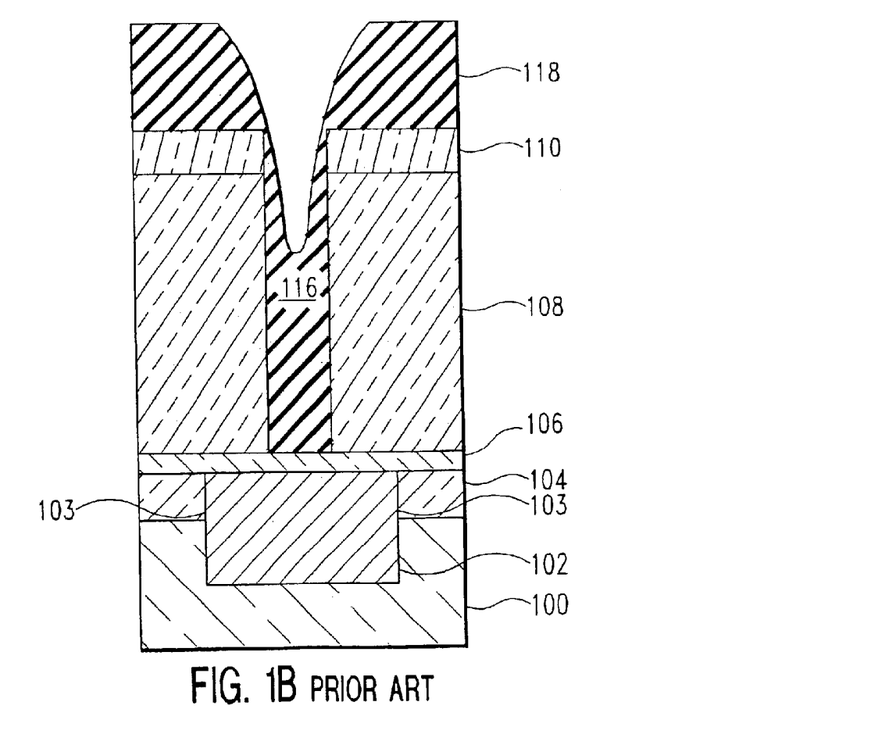

In FIG. 1B, a layer of photoresist material 118 has been applied covering the surface of the structure, and partially filling in the contact opening 116.

Figure 1C:
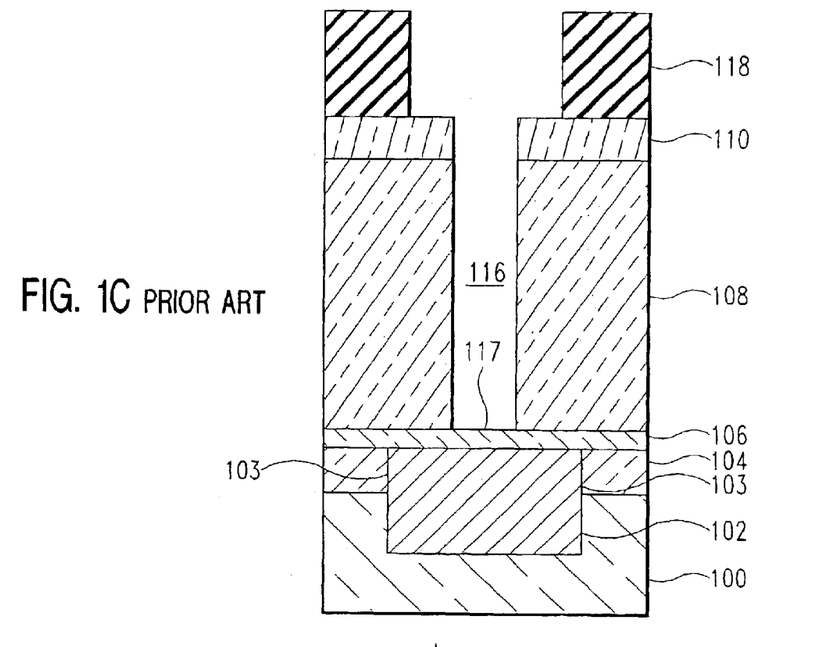

In FIG. 1C, the photoresist layer 118 has been developed, providing a patterned mask for etching of a trench which will overlie the contact opening 116.

Figure 1D:
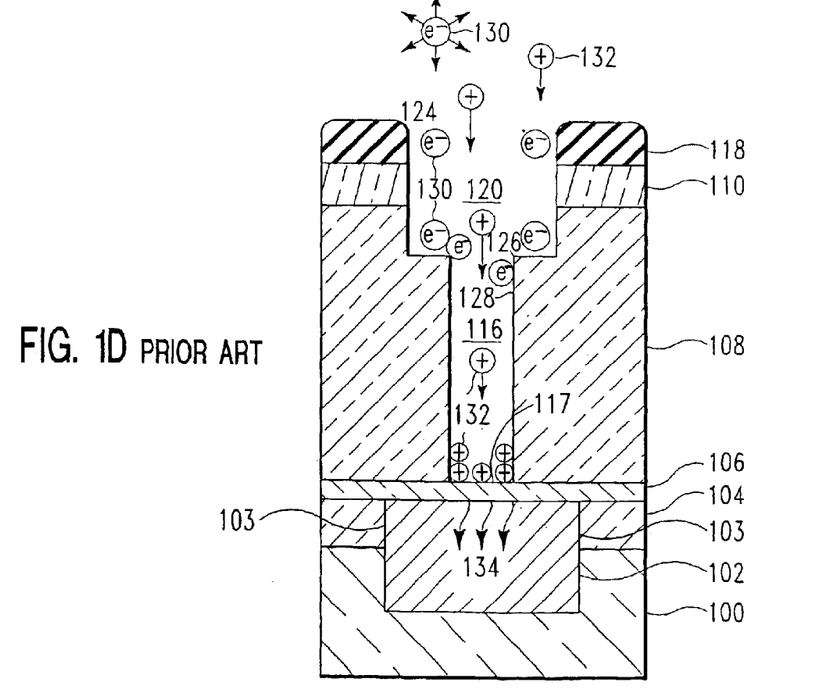

In FIG. 1D, anisotropic etching is being performed to form trench 120 through dielectric hardmask layer 110 and partly into dielectric layer 108. It is at this point in the prior art etching process to produce trench 120 that the problem of electron shading arises, as illustrated in FIG. 1D. Accumulations of excess electrons 130 form an unbalanced negative charge near the entrance 126 and on the upper sidewalls 128 of contact opening 116, and to a lesser extent on the upper sidewalls 124 of developing trench 120. As positively charged energetic species 132 continue to reach the bottom 117 of contact opening 116, but few if any electrons 130 are able to do so, a corresponding accumulation of excess positive charge builds up there, causing a tunneling current 134 which can do serious damage to the underlying conductor 102. Such damage is illustrated by numerals 136 in FIGS. 1E through 1G.

Figure 1E:
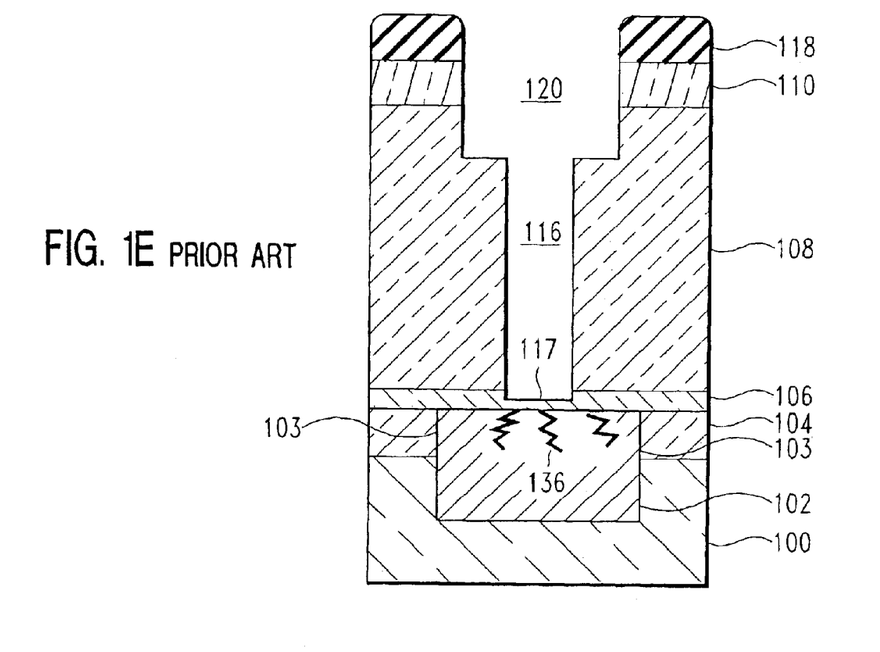

In FIG. 1E, trench 120 has been etched, directly over contact opening 116, through dielectric hardmask layer 110 and dielectric layer 108. At the same time, the bottom 117 of contact opening 116 has been etched down at least partially through etch stop layer 106.

Figure 1F:
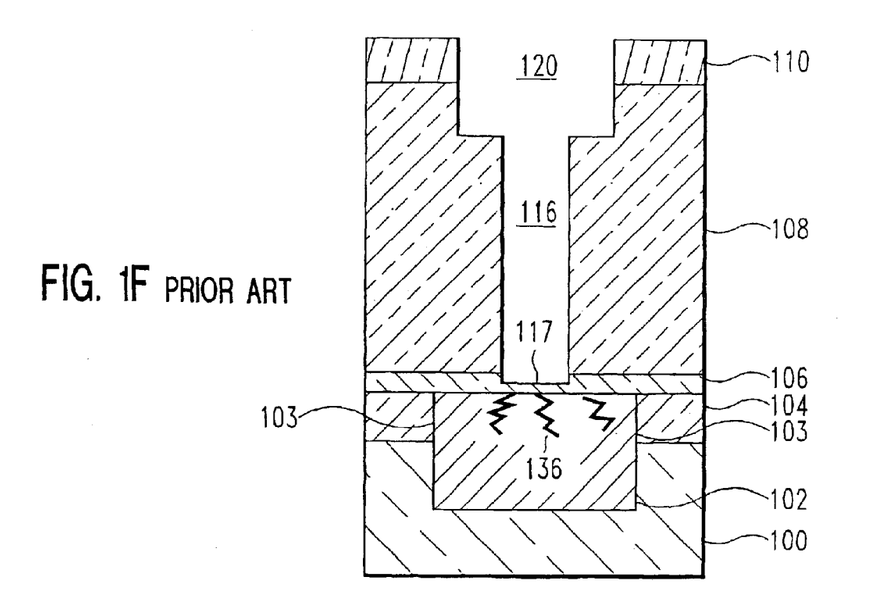
Figure 1G:
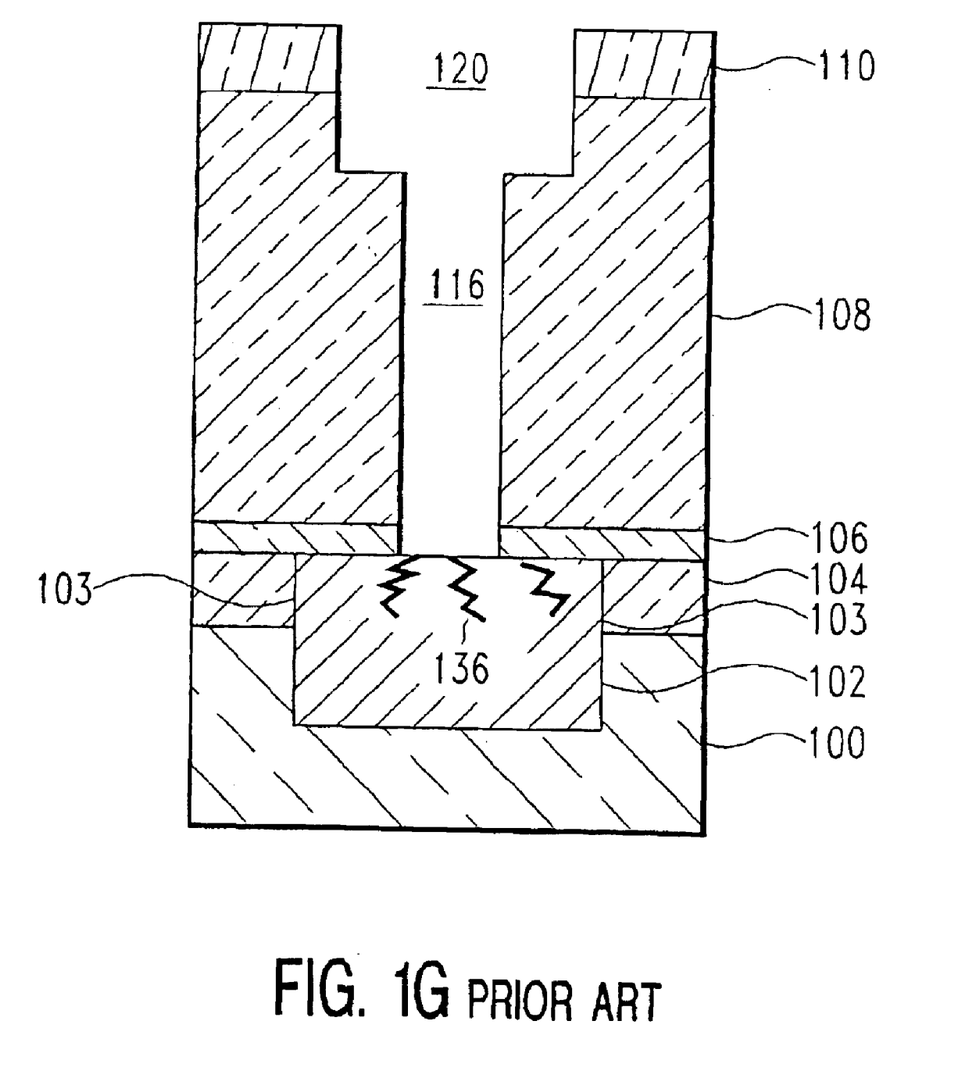

Subsequently, the residue of photoresist layer 118 has been removed, as illustrated in FIG. 1F. Finally, in FIG. 1G, the remainder of the etch-stop layer 106 at the bottom of contact opening 116 has been removed, to permit electrical contact with the conductor 102, as illustrated in FIG. 1G. Contact opening 116 and trench 120 are subsequently filled with conductive material to form the interconnect between the lower and upper layers of devices. This process can be repeated as desired to form a multilayered structure in which the active layers are electrically interconnected by conductive fill material placed in the contact openings and trenches.

Various techniques have been used in an attempt to reduce or eliminate charging damage to semiconductor devices occurring during the etching process. For example, U.S. Pat. No. 5,468,341, to Samukawa (See Abstract.), discloses a method and apparatus wherein pulse modulation of the electric fields producing the etching plasma are controlled to produce a pulse interval shorter than about 10 $\mu$sec. This is said to provide advantageous process conditions, including a reduction in charge accumulation. U.S. Pat. No. 5,441,849, to Shiraishi, et al (See abstract.) discloses a method of solving a distinct but similar problem of electrical charge accumulation During the formation of the latent image in a photoresist layer, the photoresist is exposed to a charged particle beam, where electrical charge accumulation causes positional deviation of the imaged pattern. By using a bottom-resist layer of material which can be rendered conductive by simultaneous exposure to actinic radiation (such as ultraviolet light, X-ray, or infrared light), the charge accumulation is alleviated.

SUMMARY OF THE INVENTION

The present invention reduces the amount of charging damage caused by electron shading during the process of plasma etching a trench overlying an existing electrical contact opening. This is accomplished by introducing a processing step that adds a protective layer of conductive material, generally a metal, conductive metal nitride, conductive metal oxide, or a combination thereof, lining the contact opening. This layer provides a conductive path for maintaining charge balance in the etched structures during the etching process. This protective conductive layer greatly reduces or eliminates the charge buildup caused by electron shading, and the damage done to the layers at or near the bottom of the contact opening by the tunneling current induced by such charge buildup, during trench etching. To the extent that the protective conductive layer also remains present between the dielectric layer being etched and a photoresist layer defining the trench, that protective conductive layer acts to equalize charge laterally at the top of the dielectric layer.

For purposes of describing an embodiment of the invention, FIGS. 2A through 2I illustrate a method of reducing plasma-induced charging damage during etching of a trench in a dielectric layer which forms part of a dual damascene semiconductor structure. For example, the method comprises:

a. providing a semiconductor structure including an electrical contact opening through a dielectric layer overlying an etch stop layer, which etch stop layer overlies a conductive region in the semiconductor structure;

b. applying a protective layer of a conductive material over surfaces of the electrical contact opening and over exposed horizontal surfaces adjacent the contact opening;

c. applying a layer of photoresist material over the upper surface of the semiconductor structure;

d. patterning the layer of photoresist material; and e. etching a trench overlying the electrical contact opening and through a portion of the dielectric layer, wherein charging damage to the semiconductor structure which occurs during etching is reduced by the presence of the layer of protective conductive material.

Subsequent processing steps are carried out to remove photoresist residue and an etch stop at the bottom of the contact opening. The resultant dual damascene structure exhibits a contact opening having sidewalls lined with the protective conductive layer material, ready for filling of the trench and contact opening with a conductive material.

Additional steps may then be carried out to add additional layer or layers of materials to provide a particular semiconductor device.

When the protective conductive layer comprises a material which can also serve as a diffusion barrier layer for the conductive fill material used to fill the trench and contact opening, additional processing steps to add such a barrier layer may be avoided.

In instances where the conductive protective layer can function as an anti-reflective coating ("ARC") during fabrication of the trench overlying the contact opening, separate application of an ARC layer may be avoided.

BRIEF DESCRIPTION OF THE DRAWINGS

FIGS. 2A–2I illustrate the present invention.

DETAILED DESCRIPTION OF THE INVENTION

I. Definitions

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined in context in the specification.

II. Apparatus for Practicing the Invention

The method of the present invention can be carried out in virtually any conventional semiconductor processing system having the capability of performing dry plasma etching of dielectric and conductive material layers. The steps described herein were carried out in a Super-e, eMax, or IPS etcher, commercially available from Applied Materials, Inc., Santa Clara, Calif. Although the above apparatus provides excellent results, it is expected that the method can also be carried out in other apparatus of various kinds known in the art, including, but not limited to, RF generated parallel plate; electron cyclotron resonance (ECR); high-density reflected electron; helicon wave; inductively coupled plasma(ICP); and transformer coupled plasma (TCP) apparatus. Examples of such processing apparatus are described in U.S. Pat. Nos. 6,095,084; 6,077,384; 6,074,512; 6,071,372; 6,063,233; 6,054,013; 6,036,878; 6,026,762; 6,020,686; 5,976,308; and 5,900,064, each of which is hereby incorporated by reference. One skilled in the art of semiconductor processing will be aware of, or be able to determine without undue experimentation, the appropriate process conditions for carrying out the etching of dielectric and conductive layers in other types of etchers, available in the art.

III DETAILED DESCRIPTION OF THE METHOD

In the present invention, charging damage to a semiconductor structure, caused by electron shading during plasma etching in a dual damascene structure, is alleviated by first depositing a protective conductive layer which provides a conductive path for maintaining charge balance in the etched structures. This conductive layer reduces the buildup of unbalanced positive charge in the contact opening, and consequently the damage done to underlying layers by the resultant tunneling current.

Figure 2A:
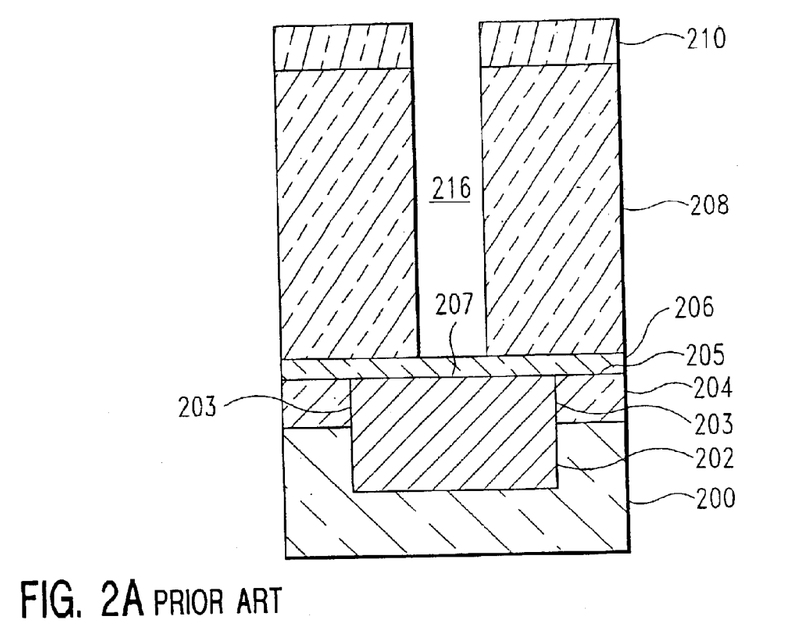
FIG. 2A shows a starting structure for one embodiment of the invention, including a conductor 202, such as s or aluminum or alloys thereof, embedded in a dielectric 200, an upper portion of the conductor contacted at sidewall 203 by a layer of a first dielectric hardmask 204, an upper surface 205 of dielectric hardmask layer 204 and an upper surface 207 of conductor 202, both covered by an etch stop layer 206, typically a dielectric such as $Si_3N_4$, SiON, or SiC. A layer of dielectric 208, which is typically a low-k dielectric, overlies the etch stop layer 206, and is itself overlain by a second dielectric hardmask layer 210. An electrical contact opening 216 has been opened from the upper surface of the dielectric hardmask layer 210 downward through both that hardmask layer 210 and underlying dielectric layer 208, ending at the upper surface of underlying etch stop later 206.

The starting structure for this illustrative embodiment of the present invention is as shown in FIG. 2A, in which a conductor 202, such as copper or aluminum or alloys thereof, is embedded in a dielectric 200, an upper portion of the conductor is contacted at sidewall 203 by a layer of a first dielectric hardmask 204, and an upper surface 205 of dielectric hardmask layer 204 and an upper surface 207 of conductor 202 are both covered by an etch stop layer 206, typically a dielectric such as $Si_3N_4$, SiON, or SiC. An electrical contact opening 216 runs from the upper surface of the dielectric hardmask layer 210, downward through that hardmask layer 210 and underlying dielectric layer 208, terminating at the upper surface of underlying etch stop layer 206.

Figure 2B:
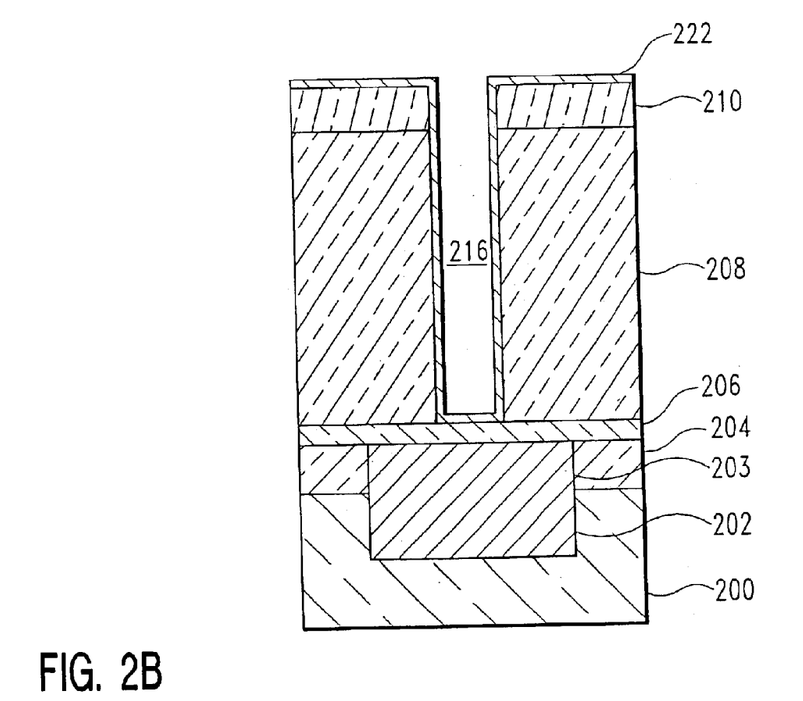
FIG. 2B shows the application of protective conductive layer 222 over the structure of FIG. 2A.

In the present invention a protective conductive layer 222, as shown in FIG. 2B, is deposited over the top of the dielectric hardmask layer 210, including on the floor and sidewalls of previously formed contact opening 216. The deposition of protective conductive layer 222 is advantageously carried out using Physical Vapor Deposition ("PVD"), including DC or RF sputtering or ionized physical vapor deposition, at least to the point where PVD can no longer reach the bottom of a high aspect ratio contact opening. It can also be carried out using chemical vapor deposition, ("CVD"), plasma-enhanced CVD ("PECVD"), or metal organic chemical vapor deposition ("MOCVD"), or combinations of these techniques.

The protective conductive layer 222 comprises a conductive material, generally a metal since it will be present in a very thin film and must permit sufficient charge mobility to largely or wholly neutralize the problematic excess positive charge at the bottom of the contact opening. It will often be advantageous for the protective conductive layer to comprise a material which can function as a barrier layer against the interdiffusion of copper or other conductors used to fill the contact opening and other materials present in the semiconductor structure. Depending upon the conductive materials being used to fill the contact opening, such conductive materials as Ti, TiN, Ta, TaN, W, WN, Al, Pt, Ir, $IrO_x$, Ru, $RuO_x$, Rh, Ag, or combinations thereof, are highly appropriate materials for the protective conductive layer.

Figure 2C:
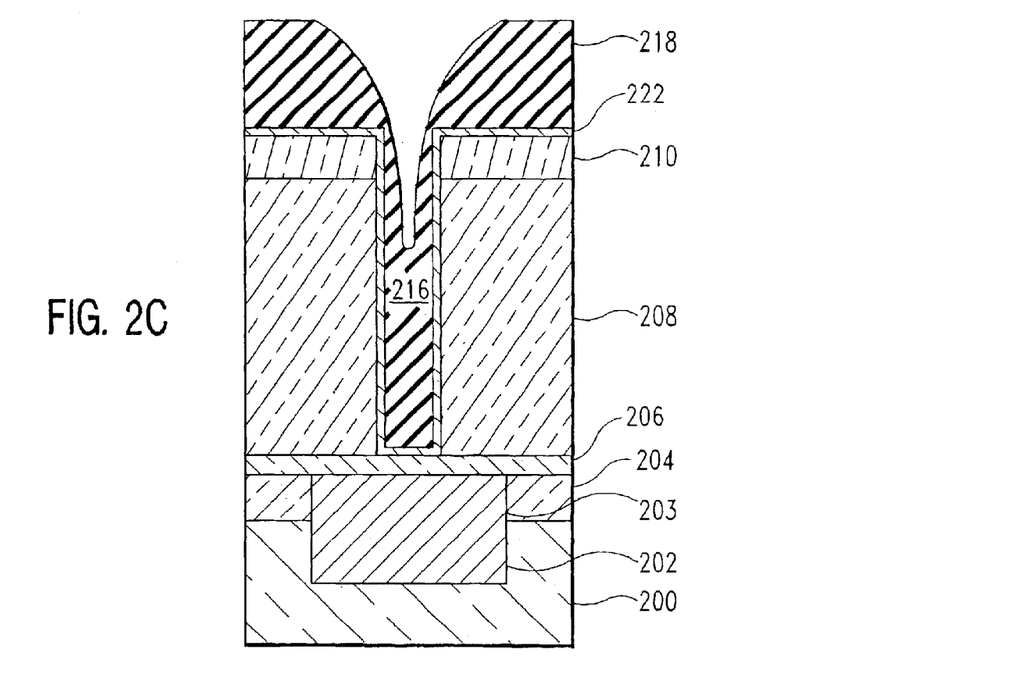
FIG. 2C shows a layer of photoresist material 218 applied over the protective conductive layer 222.

Once the protective conductive layer 222 is in place, as in FIG. 2B, a layer of photoresist 218 is applied, and covers the protective conductive layer 222, including partially filling contact opening 216, as shown in FIG. 2C.

Figure 2D:
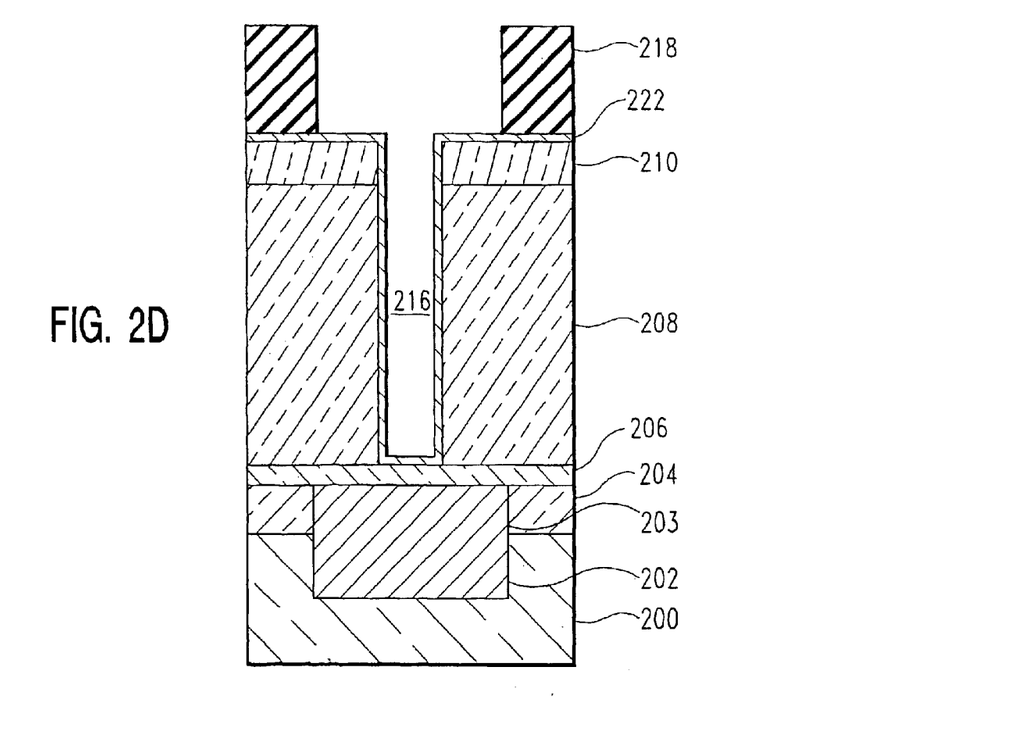
FIG. 2D shows the developed photoresist layer 218, providing a patterned mask defining the trench to be etched.

The photoresist layer 218 is then patterned, by being exposed and developed, leaving a portion of the protective conductive layer 222, overlying second dielectric hardmask 210, covered by resist 218, and a portion exposed, as shown in FIG. 2D.

Figure 2E:
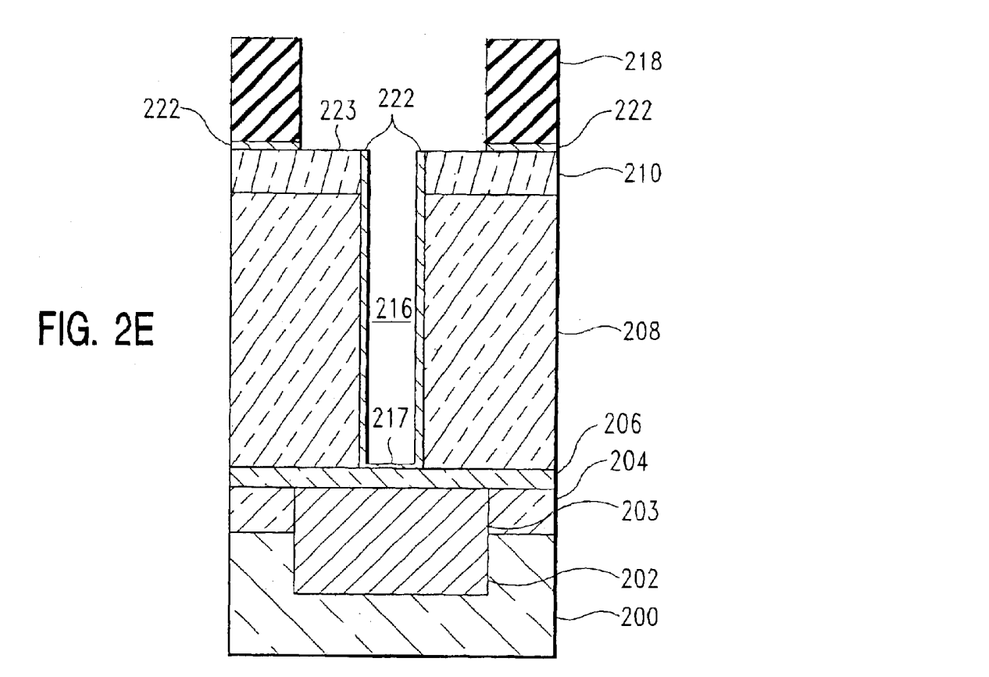
FIG. 2E shows the protective conductive layer 222 etched off the top of the exposed upper surface 223 of the second dielectric hardmask layer 210, except where it is covered by the patterned photoresist masking layer 218. The thickness of the protective conductive layer 222 at the bottom of the contact opening 216 is typically reduced during removal of the protective conductive layer 222 from the upper surface 223 of the second dielectric hardmask layer 210.

During the trench etch step, the exposed area of protective conductive layer 222 is first anisotropically etched from the exposed portion of the top of the dielectric hardmask layer 210, and at least partially from the bottom 217 of the contact opening 216, but remains on the sidewalls of the contact opening, as shown in FIG. 2E.

Figure 2F:
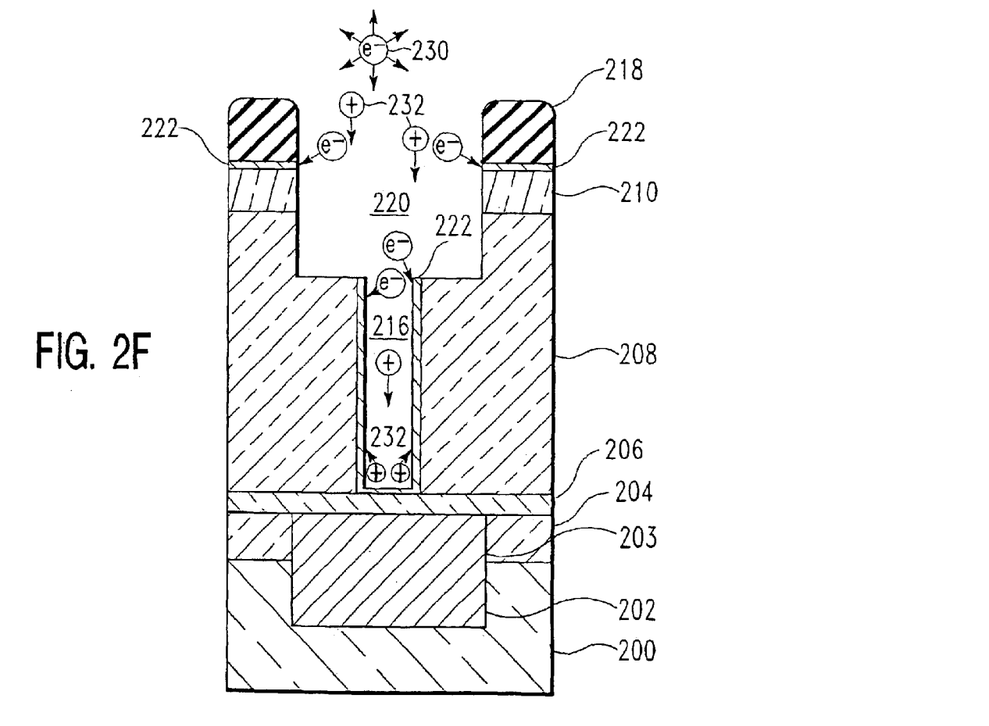
FIG. 2F shows the etching of a trench 220 overlying the electrical contact opening 216, and illustrates how the present invention reduces charging damage relative to the prior art process.

Further anisotropic etching is carried out, as illustrated in FIG. 2F, to etch the trench 220 into the dielectric hardmask 210 and underlying dielectric layer 208. The present invention's protective conductive layer 222 on the contact opening 216 sidewall greatly reduces charging damage to the underlying structure, by permitting the mutual neutralization of the excess positive charge 232, which would otherwise accumulate in the bottom of the contact opening 216, and the excess electrons 230, which would otherwise accumulate at the top of the contact opening sidewall.

As also illustrated in FIG. 2F, the segments of protective conductive layer 222 remaining at the top of the trench, buried beneath the resist layer 218, also serve to balance charge in the structure by creating a grounding source, conducting away electric charges arising there, either because of electron 230 accumulation at the tops of the trenches, or more generally because of non-uniformity in the plasma across the wafer.

With the benefit of charge dissipation through protective conductive layer 222, conductor 202 remains unharmed through the process of etching trench 220.

Figure 2G:
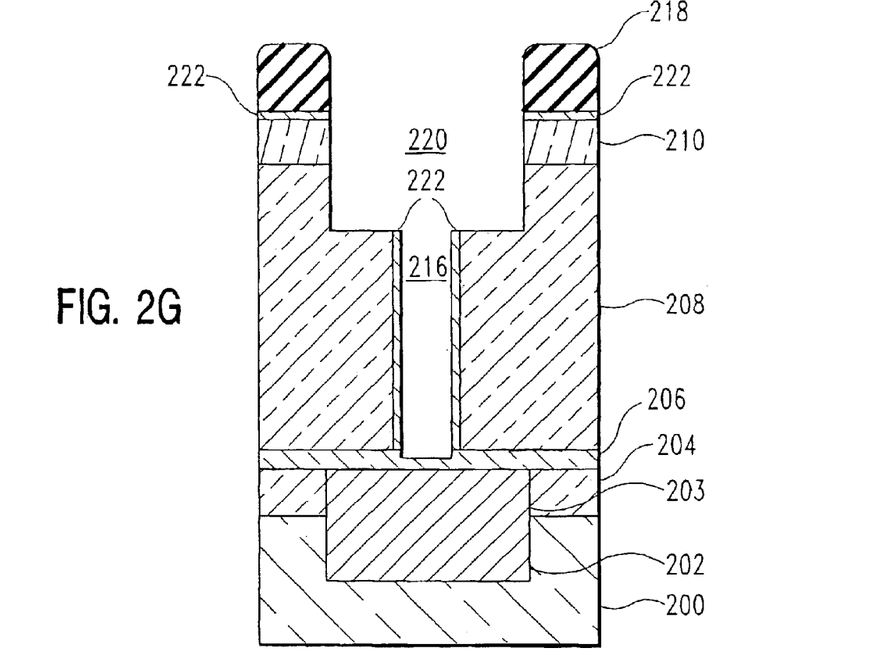
FIG. 2G shows the removal of the remaining exposed portion of protective conductive layer 222 and a portion of the etch stop layer 206 at the bottom of the contact opening 216.

FIG. 2G illustrates that, by the time the trench 220 is etched to a desired depth, most or all of the remaining protective conductive layer 222, and probably a portion of the etch stop layer 206, have also been etched from the bottom of the contact opening 216. Because of the anisotropic etch process, however, the protective conductive layer 222 remains intact on the sidewalls of the contact opening 216.

Figure 2H:
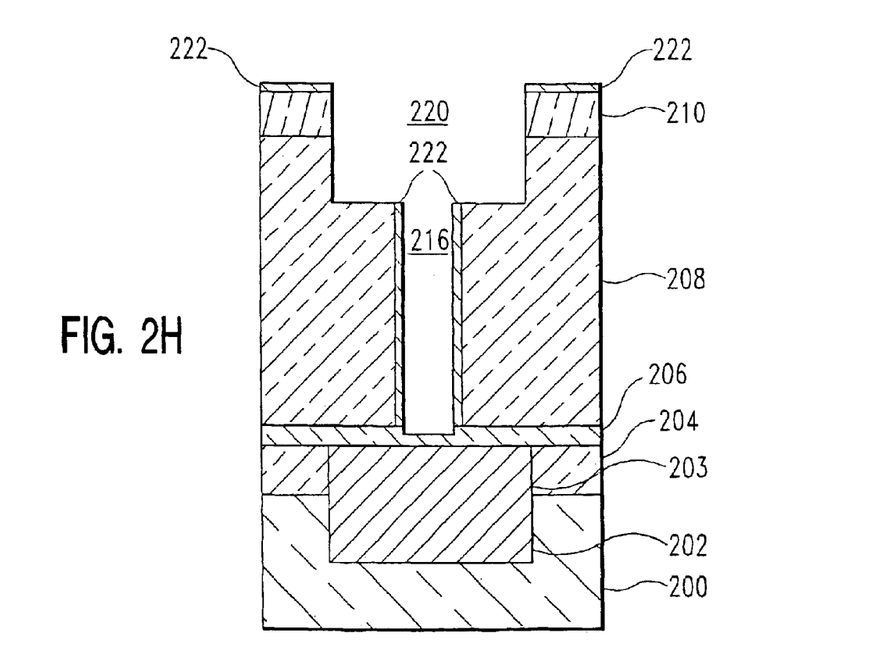
FIG. 2H shows the removal of photoresist residue.

The remaining resist 218 is then stripped off, leaving exposed the segments of protective conductive layer 222 overlying the dielectric hardmask layer 210, as shown in FIG. 2H.

Figure 2I:
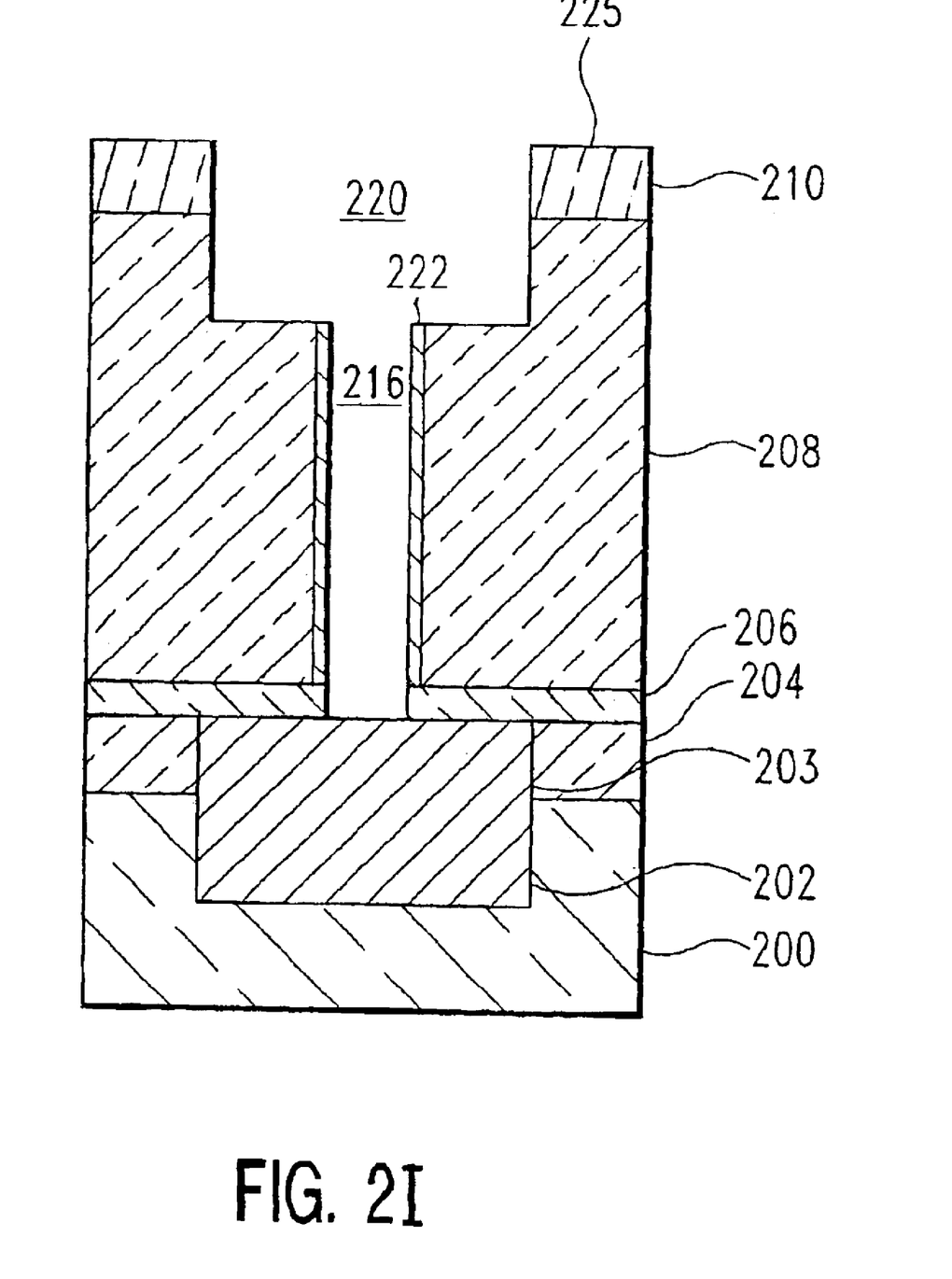
FIG. 2I shows the removal of residual protective conductive layer 222 from the upper surface 225 of the dielectric layer 208, and removal of the remaining etch stop layer 206 from the bottom of the contact opening 216.

Then, the protective conductive layer 222, both on top of the dielectric hardmask layer 210 and any remaining at the bottom of contact opening 216, and the remaining etch stop layer 206 at the bottom of contact opening 216 are anisotropically etched away, as shown in FIG. 2I. This etching process may be carried out in two steps if necessary, a first step in which said protective conductive layer 222 is removed, and possibly a portion of the etch stop layer, and a second step in which any remaining etch stop layer is removed. This leaves the trench 220 and contact opening 216, the latter with nothing separating it from the underlying conductor 202, ready to be filled with conductor(s) to complete the interconnect between active layers, followed by the subsequent fabrication of additional levels above, if desired.

As discussed above, the protective conductive layer 222 can be virtually any conductor to realize the charge equalization advantages of the present invention, but is typically a metal, a conductive metal nitride, or a conductive metal oxide, or a combination thereof. When the protective conductive layer is a metal nitride, for example, it may also serve as a barrier to interdiffusion of the conductor subsequently used to fill the contact opening. This is an advantage, as it is possible to avoid a separate step for application of a diffusion barrier layer. Conductive materials which are also useful as barrier layers include Ti, TiN, Ta, TaN, W, and WN, for example and not by way of limitation. Often the materials will be used in combination, such as Ti/TiN, Ta/TaN, and W/WN, again for example and not by way of limitation. The best choice of material for a given application depends upon the composition of the material to be used as a conductor to fill the contact opening and the trench, and that of the dielectric layer or layers.

In performing the lithography for creation of the patterned photoresist 118 to define the trench overlying the contact opening 116, the exposure tool, or "stepper," positions the photolithographic mask to line up the trench properly above the etched contact opening, and to focus the mask image on the right plane of the structure. This assures a properly located and critically sharp lithographic image in the resist layer, and promotes accurately produced features. This stepper functions by indexing from optical targets at various locations on the various levels of the semiconductor structure. In the conventional process shown in comparative example in FIGS. 1A–1G, when attempting to locate the target for patterning the second or subsequent layers of resist, the stepper can sometimes confuse a reflected image of from an underlying structure for the actual target on which it is supposed to be focusing. This results in the stepper focusing at the wrong distance, which in turn produces an unsharp image in the photoresist, and ultimately degrades the quality of the lithographed lines in the device. However, when the method of the present invention is used, the protective conductive layer 222 that is placed over the device and in the contact opening before the trench etch step may also function as an antireflective coating (ARC) over the top of the semiconductor structure, reducing or preventing such confusing multiple reflected images. The stepper can therefore more accurately focus on the correct target, producing a properly located and focused pattern on the resist, and an improved resist profile once developed, which in turn improve the etched feature accuracy and profile.

The above described embodiments are not intended to limit the scope of the present invention, as one skilled in the art can, in view of the present disclosure, expand such embodiments to correspond with the subject matter of the invention claimed below.

What is claimed is:

1. A method of reducing plasma-induced charging damage in a dielectric trench etch process for a dual damascene semiconductor structure, said method comprising the following steps, in the order stated:
  (a) providing a semiconductor structure comprising from bottom to top
    (1) a semiconductor substrate
    (2) a conductor embedded in said substrate, having an upper portion of said conductor contacted at its sidewall by a first layer of dielectric material, an upper surface of said conductor and an upper surface of said first dielectric layer being covered by an etch stop layer,
    (3) a second layer of dielectric material overlying said etch stop layer,
    (4) a dielectric hardmask layer overlying said second layer of dielectric material,
    (5) a contact opening extending downward from a top surface of said dielectric hardmask layer, and through said second dielectric layer, said contact opening comprising a sidewall extending downward through said second dielectric layer, and ending at said etch stop layer, which provides a floor of said contact opening;
  (b) depositing upon an exposed upper surface of said second dielectric layer, and upon said sidewall of said contact opening, and upon said floor of said contact opening, a continuous layer of a protective conductive material;
  (c) applying a layer of photoresist material;
  (d) patterning said layer of photoresist material in a manner defining the location for plasma etching of a trench in an upper surface of said dielectric hardmask layer, immediately over and communicating with said contact opening;
  (e) anisotropically plasma etching said trench downward and through said dielectric hardmask layer, and downward into, but not through, said second dielectric layer, to a nominal trench depth;
  (f) removing said photoresist layer which remains, if any, following said etching of said trench;
  (g) anisotropically plasma etching away said protective conductive layer, if any, which remains upon said dielectric hardmask layer or upon said floor of said contact opening, and a portion of said etch stop layer which is exposed through said contact opening, but not said protective layer which remains upon said sidewall of said contact opening; and
  (h) anisotropically plasma etching away any of said etch stop layer material remaining on the floor of said contact opening after completion of step (g), thereby exposing a surface of said conductor embedded in said semiconductor substrate.

2. The method of claim 1, wherein said protective conductive layer deposited in step (b) comprises a material capable of functioning as an antireflective coating.

3. The method of claim 1, wherein said second dielectric layer comprises a low-k dielectric material exhibiting a relative dielectric permitivity of less than about 3.9.

4. The method of claim 1, wherein said protective conductive layer comprises a metal, or a conductive metal nitride, or a conductive metal oxide, or a combination thereof.

5. The method of claim 1, wherein said protective conductive layer is formed from a material selected from the group consisting of Al, Pt, Rh, Ag, Ti, TiN, Ta, TaN, W, WN, Ir, $IrO_x$, Ru, $RuO_x$, and alloys and combinations thereof.

6. The method of claim 1, wherein said protective conductive layer is selected from the group consisting of Al, Pt, Ir, Ru, Rh, Ag, Ti, Ta, W, and alloys and combinations thereof.

7. The method of claim 6, wherein said protective conductive layer is selected from the group consisting of Al and non-diffusing alloys of aluminum.

8. The method of claim 1 wherein said protective conductive layer deposited in step (b) comprises a material capable of functioning as a diffusion barrier layer.

9. The method of claim 8, wherein said protective conductive layer is formed from a material selected from the group consisting of Ti, TiN, Ta, TaN, W, WN, and combinations thereof.

10. The method of claim 9, wherein said protective conductive layer comprises Ti, TiN, or combinations thereof.

11. The method of claim 9, wherein said protective conductive layer comprises Ta, TaN, or combinations thereof.

12. The method of claim 9, wherein said protective conductive layer comprises W, WN, or combinations thereof.

13. A method of reducing plasma-induced charging damage in a dielectric trench etch process for a dual damascene semiconductor structure, said method comprising the following steps, in the order stated:
   (a) providing a semiconductor structure comprising from bottom to top
      (1) a semiconductor substrate
      (2) a conductor embedded in said substrate, having an upper portion of said conductor contacted at its sidewall by a first layer of dielectric material, an upper surface of said conductor and an upper surface of said first dielectric layer being covered by an etch stop layer,
      (3) a second layer of dielectric material overlying said etch stop layer,
      (4) a dielectric hardmask layer overlying said second layer of dielectric material,
      (5) a contact opening extending downward from a top surface of said dielectric hardmask layer, and through said second dielectric layer, said contact opening comprising a sidewall extending downward through said second dielectric layer, and ending at said etch stop layer, which provides a floor of said contact opening;
   (b) depositing upon an exposed upper surface of said second dielectric layer, and upon said sidewall of said contact opening, and upon said floor of said contact opening, a continuous layer of a protective conductive material;
   (c) applying a layer of photoresist material;
   (d) patterning said layer of photoresist material in a manner defining the location for plasma etching of a trench in an upper surface of said dielectric hardmask layer, immediately over and communicating with said contact opening;
   (e) anisotropically plasma etching said trench downward and through said dielectric hardmask layer, and downward into, but not through, said second dielectric layer, to a nominal trench depth;
   (f) removing said photoresist layer, if any, which remains following said etching of said trench; and
   (g) anisotropically plasma etching away said protective conductive layer, if any, which remains upon said dielectric hardmask layer or upon said floor of said contact opening, and said etch stop layer which is exposed through said contact opening, thereby exposing a surface of said conductor embedded in said semiconductor substrate.

14. The method of claim 13, wherein said protective conductive layer deposited in step b comprises a material capable of functioning as a diffusion barrier layer.

15. The method of claim 13, wherein said protective conductive layer deposited in step b comprises a material capable of functioning as an antireflective coating.

* * * * *